US006790066B1

(12) United States Patent
Klein

(10) Patent No.: US 6,790,066 B1
(45) Date of Patent: Sep. 14, 2004

(54) APPARATUS FOR SECURING A CABLE ASSEMBLY WITHIN AN ENCLOSED ELECTRONIC SYSTEM

(75) Inventor: Barry L. Klein, Trabuco Canyon, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 59 days.

(21) Appl. No.: 10/307,271

(22) Filed: Nov. 27, 2002

(51) Int. Cl.[7] .............................................. H01R 13/52
(52) U.S. Cl. ..................................................... 439/271
(58) Field of Search ................................ 439/345, 350, 439/533, 544, 545, 926

(56) References Cited

U.S. PATENT DOCUMENTS 6,368,114 B1 * 4/2002 Inoue ........................... 439/34

* cited by examiner

*Primary Examiner*—Khiem Nguyen
(74) *Attorney, Agent, or Firm*—Won Tae C. Kim, Esq.; Milad G. Shara, Esq.; Ramin Mobarhan, Esq.

(57) ABSTRACT

An apparatus is disclosed for securing a cable assembly having a connector within an enclosed electronic system which includes a housing with an aperture and an electronic subsystem mounted within the housing with an electrical port for receiving the connector. The apparatus includes a compressible grommet fixedly mounted within the housing. The apparatus further includes a first surface and a distal surface and a channel traversing through the grommet and having a first end at the first surface aligned with the aperture, and a distal end at the distal surface substantially aligned with the electrical port. The grommet is adapted to receive the connector at the first end and to guide the connector along the channel to the distal end and the electrical port wherein the connector may be thereafter inserted into the electrical port and is thereby restrained by the grommet.

22 Claims, 6 Drawing Sheets

Section A-A

APPARATUS FOR SECURING A CABLE ASSEMBLY WITHIN AN ENCLOSED ELECTRONIC SYSTEM

FIELD OF THE INVENTION

The present invention relates to apparatus for securing a cable assembly. More particularly, this invention pertains to a fixedly mounted compressible grommet for securing a cable assembly.

BACKGROUND OF THE INVENTION

Electronic systems which are housed in separate enclosures are frequently connected to one another by one or more cable assemblies having a connector at each end. For example, a personal computer may have an electronic circuit such as a printer interface mounted on an internal motherboard. In order to connect to an external printer, an intermediate cable assembly is deployed to provide an exposed connector for connecting the printer with an external cable assembly. In another example, an external storage peripheral, such as a disk drive, may be connected to a personal computer. Conventionally, both the personal computer and the external storage peripheral may have internal intermediate cable assemblies. One motivation for the intermediate cable assemblies is to eliminate the need for a user to open the enclosure to connect the external cable. Another motivation is to provide a connection scheme which has positive locking such as a thumbscrew or clip. Typically internally disposed electronic subsystems such as the motherboard or disk drive examples above do not provide for positive locking of cable connectors because the intermediate cable assembly is not subject to stress or movement. Such a positive locking feature provides for strain relief of the cable and prevents accidental disconnection if the cable is inadvertently moved, nudged or kicked.

Although the intermediate cable assembly provides benefits as indicated above, a cost penalty is incurred. What is needed is a cost effective solution for cabling electronic systems together while preventing cable stress or inadvertent disconnection.

SUMMARY OF THE INVENTION

This invention can be regarded as an apparatus for securing a cable assembly having a connector within an enclosed electronic system. The electronic system includes a housing with an aperture and an electronic subsystem mounted within the housing with an electrical port for receiving the connector. The apparatus includes a compressible grommet fixedly mounted within the housing. The apparatus further includes a first surface and a distal surface and a channel traversing through the grommet and having a first end at the first surface aligned with the aperture, and a distal end at the distal surface substantially aligned with the electrical port. The grommet is adapted to receive the connector at the first end and to guide the connector along the channel to the distal end and the electrical port wherein the connector may be thereafter inserted into the electrical port and is thereby restrained by the grommet.

DETAILED DESCRIPTION OF THE INVENTION

Figure 1A:
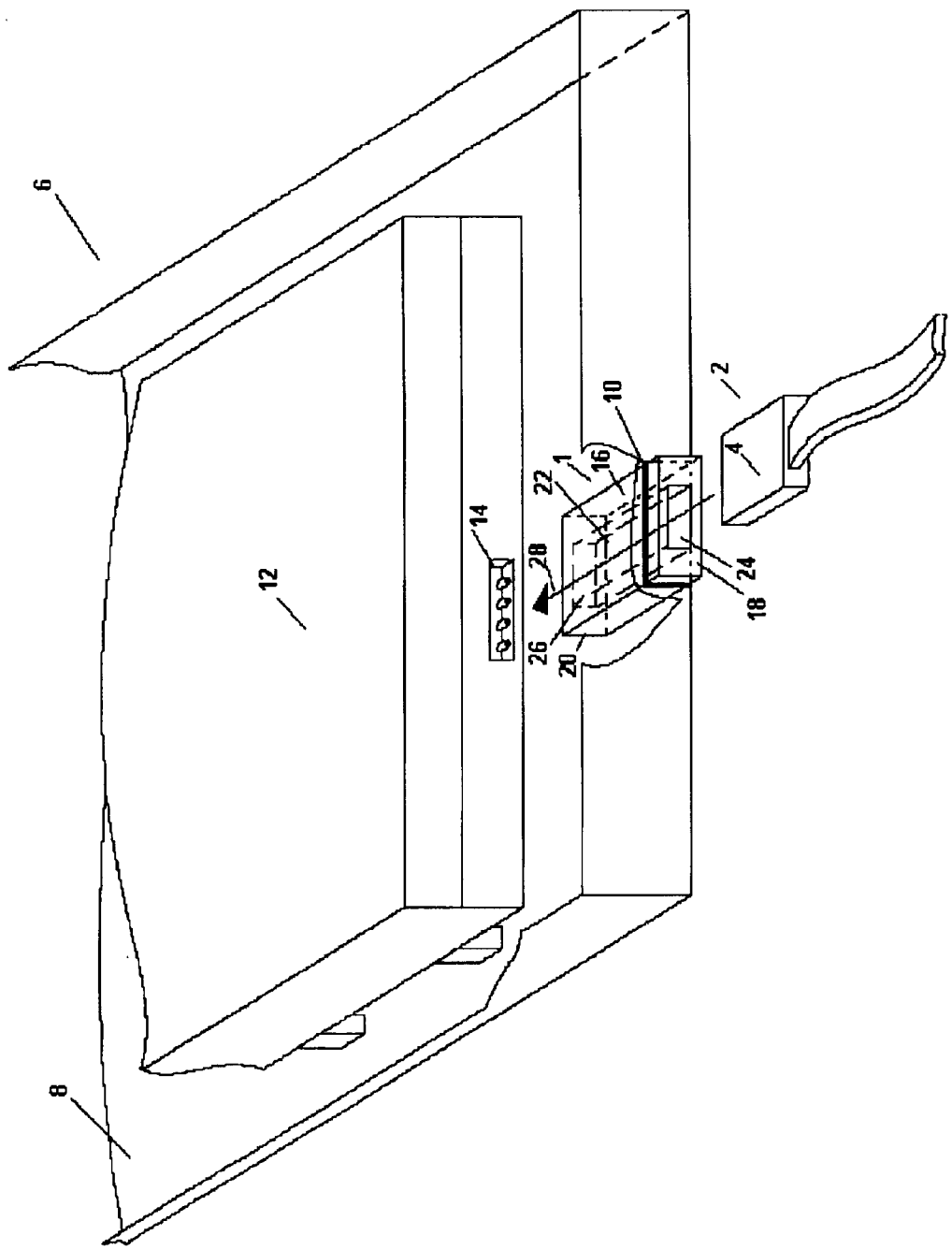
FIGS. 1A-B are perspective views of an electronic system having an electronic subsystem, a housing and a compressible grommet fixedly mounted within the housing.

With reference to FIG. 1A, an apparatus 1 is shown for securing a cable assembly 2 having a connector 4, within an enclosed electronic system 6. The electronic system 6 has a housing 8 (partially shown) with an aperture 10, and an electronic subsystem 12 mounted within the housing 8 and having an electrical port 14 for receiving the connector 4. The apparatus 1 includes a compressible grommet 16 fixedly mounted within the housing 8. In a preferred embodiment, the grommet 16 protrudes through the aperture 10 which fixates the grommet 16 to the housing 8. The compressible grommet 16 further includes a first surface 18 and a distal surface 20 (shown in phantom), and a channel 22 traversing through the grommet 16 and having a first end 24 at the first surface 18 aligned with the aperture 10, and a distal end 26 (shown in phantom) at the distal surface 20 substantially aligned with the electrical port 14. In the preferred embodiment, the channel 22 is of a dimensionally smaller cross-section than the connector 4. The grommet 16 is adapted to receive the connector 4 at the first end 24 and to guide the connector 4 along the channel 22 in the direction shown by arrow 28, to the distal end 26 and the electrical port 14. The connector 4 may be thereafter inserted into the electrical port 14 and is thereby restrained by the grommet 16, as shown in and describe in greater detail in conjunction with FIG. 1B. In the preferred embodiment, the grommet 16 may be suitably fabricated of a pliable material, such as of a silicone rubber composition. In a preferred embodiment, the compressible grommet is dimensionally elongated between the first surface 18 and distal surface 20 along the direction of the channel 22. In a preferred embodiment, the elongated compressible grommet is of a substantially rectangular-cubic shape such as shown in FIGS. 1A-B.

Figure 1B:
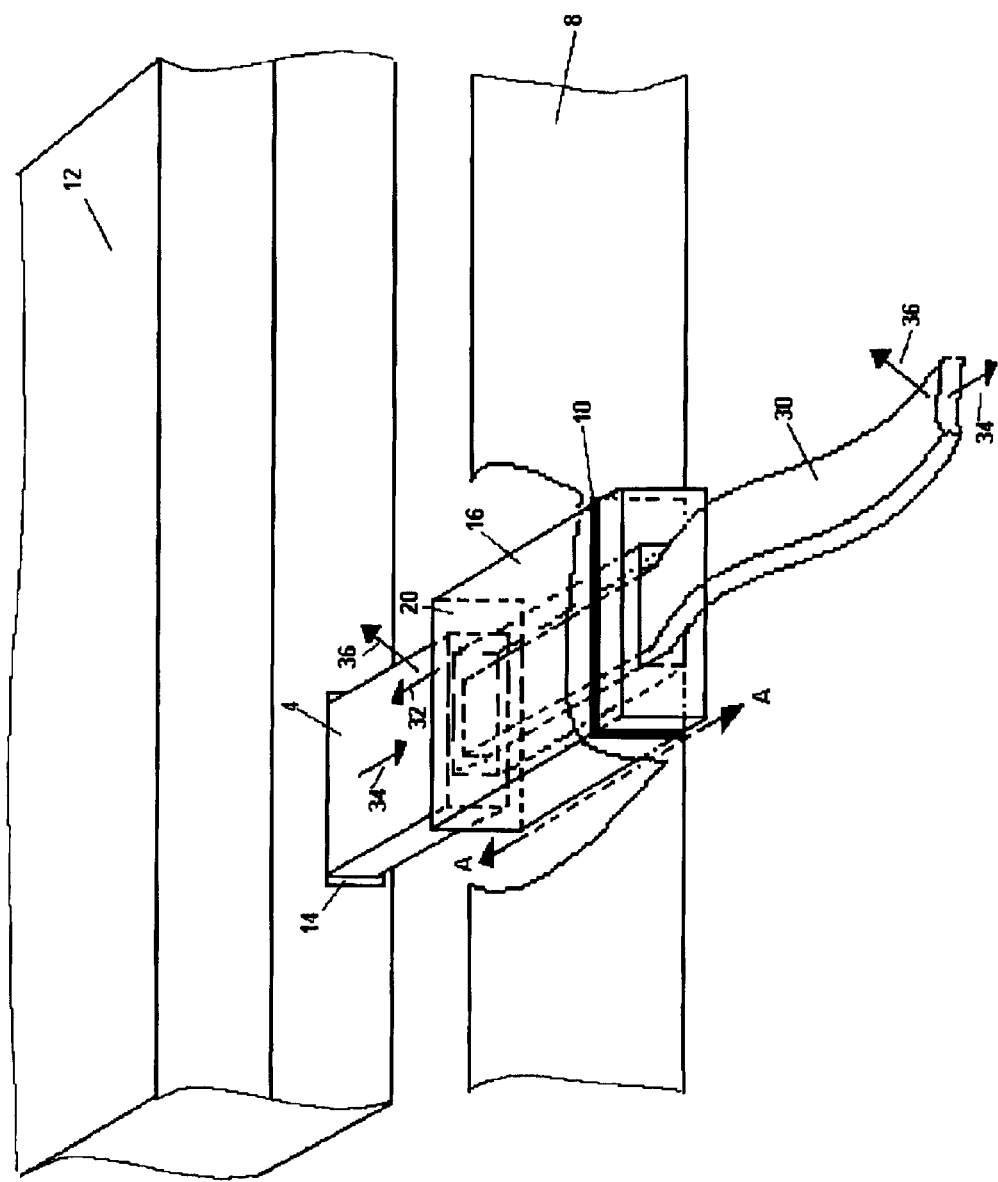

With reference to FIG. 1B, following insertion of the connector 4 into the electrical port 14, the grommet 16 remains in contact with the inserted connector 4 and exerts a bias force 32 in the direction of the electronic subsystem 12 on the inserted connector 4 at the distal surface 20 to substantially restrain the connector 4 between the electronic subsystem 12 and the distal surface 20. One advantage of the foregoing feature of the present invention is that the bias force minimizes 32 a substantial de-insertion of the inserted connector 4 from the electrical port 14 due to an external de-insertion force 34 exerted on the connector 4 via the cable 30, such as when the cable 30 is inadvertently moved, nudged or kicked. The bias force 32 also minimizes a substantially vertical flexing of the inserted connector 4 due to an external flexing force 36 exerted on the connector 4, such as via the cable 30. In a preferred embodiment, the cable 30 is an SATA cable and the connector 4 is an SATA connector.

Figure 2:
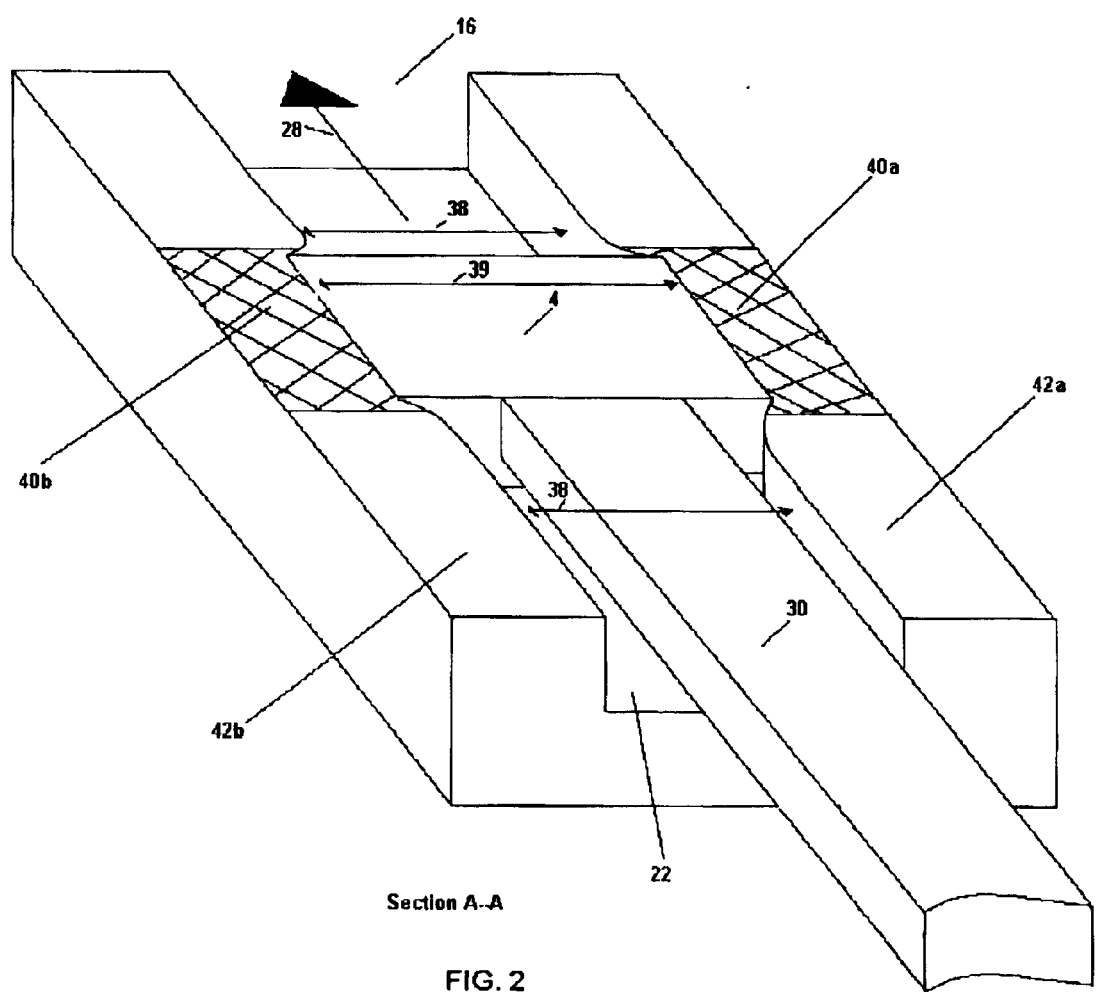
FIG. 2 is a magnified cross sectional view of the compressible grommet shown in FIGS. 1A-B.

With reference to FIG. 2, a cross-sectional view of the grommet 16 taken at line A—A of FIG. 1B is shown, which illustrates the passages of the connector 4 and cable 30 through the channel 22, such as along the direction shown by arrow 28. As shown, the passage of the connector 4 through the channel 22 causes the grommet 16 to compress in regions of the channel 22 adjacent to the connector 4, such as regions 40a and 40b, to dimensionally enlarge the cross-section 38 of the channel 22 to a cross section of 39 in the adjacent regions thus allowing the passage of the connector 4 through the channel 22. As also shown, following the passage of the connector 4, the compressed regions in grommet 16 revert to a substantially decompressed state, such as regions 42a and 42b, thus substantially reverting the channel 22 to a dimensionally smaller cross section than that of connector 4, such as to cross section 38.

Figure 3A:
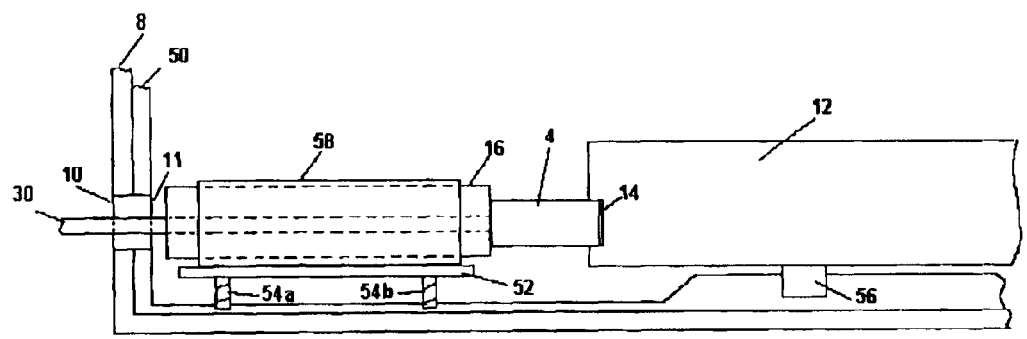
FIGS. 3A-D are side cross sectional views of various preferred embodiments of the present invention wherein the electronic subsystem is a disk drive.

FIGS. 3A-D are side cross sectional views of various preferred embodiments of the present invention wherein the electronic subsystem 12 is a disk drive. With reference to FIG. 3A, a preferred embodiment of the present invention is shown in which a base plate 50 is disposed within the housing 8 and having an aperture 11 aligned with aperture 10 to allow passage of the connector 4 and cable 30. A connector-support assembly 50 is mounted within the housing 8 via the base plate 50 and is substantially aligned with the aperture 10. In a preferred embodiment, the connector-support assembly 52 is rigidly mounted on the base-plate 50, such as by metal stand offs and screws 54a and 54b. The compressible grommet 16 is fixedly mounted on the connector-support assembly 52, such as by adhesives, screw, and other fastening means well known in the art. In a preferred embodiment, the electronic subsystem 12 is floatingly mounted on the base-plate 50 by a shock isolation assembly 56, such as silicon shock-isolating washers, or other floatingly-mount devices well known in the art. In a preferred embodiment, the connector-support assembly 52 is a Bridge Printed Circuit Board Assembly (BPCBA).

As also shown in the preferred embodiment of FIG. 3A, the grommet 16 is an electromagnetic interferences (EMI) shielded grommet to minimize EMI. In a preferred embodiment, the EMI-shielded grommet includes an EMI-shield coating 58 disposed adjacent to the grommet 16 and fixedly mounted on the connector-support assembly 52 such as by adhesives, screw, and other fastening means well known in the art. In a preferred embodiment, the EMI-shield coating 58 is of a metallic composition, and characterized by a thickness of 0.1 millimeter. In another preferred embodiment, the grommet 16 is itself of a composition enhanced with metallization to minimize EMI.

Figure 3B:
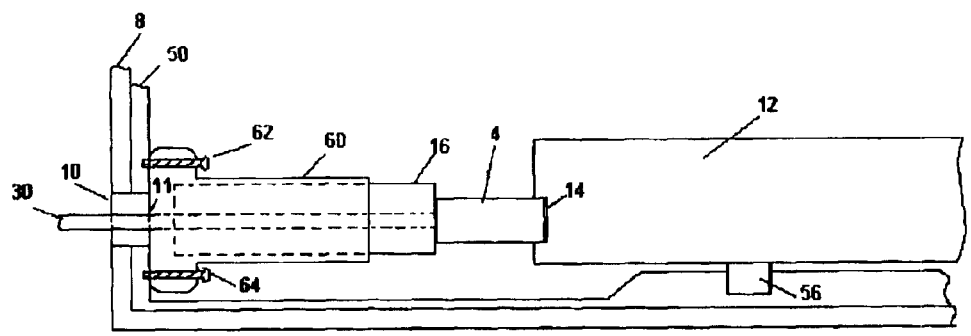

With reference to FIG. 3B, a preferred embodiment of the present invention is shown in which the grommet 16 is fixedly mounted on the base plate 50 substantially adjacent to aperture 11, via a mounting device 60 adapted to receive the grommet 16. The mounting device 60 is then fixedly mounted on the base plate 50 such as by a pair of screws 62 and 64.

Figure 3C:
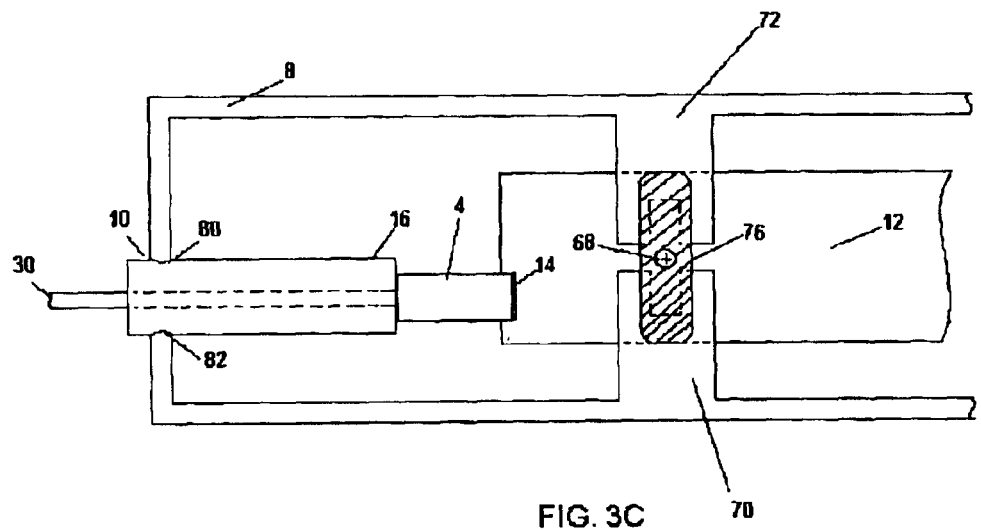

With reference to FIG. 3C, a preferred embodiment of the present invention is shown in which the electronic subsystem 12 is mounted on a pair of risers 70 and 72 integrally formed within the housing 8. In a preferred embodiment, a silicone shock washers 76 is slipped onto the riser 70 and 72 is fixated to the electronic subsystem 12 via screw 68. In a preferred embodiment, the grommet 16 protrudes through the aperture 10 which compresses the grommet 16 in regions adjacent to the aperture 10, such as regions 80 and 82, to fixate the grommet 16 to the housing 8.

Figure 3D:
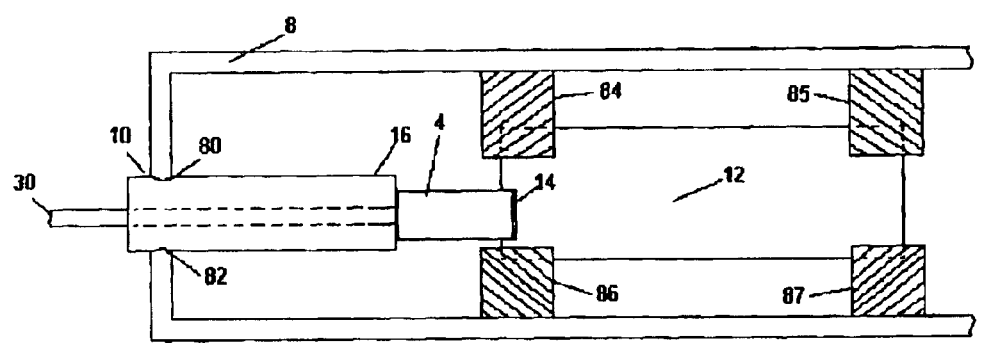

With reference to FIG. 3D, a preferred embodiment of the present invention is shown in which the electronic subsystem 12 is mounted directly on two pair of silicone shock washers 84, 85, and 86, 87 that are mounted on the housing 8 and provide compression fit shock isolation to the electronic subsystem 12. In a preferred embodiment, each of the shock washers 84, 85, 86 and 87 is of a substantially cubic-rectangular shape adapted to receive the electronic subsystem 12.

Figure 4A:
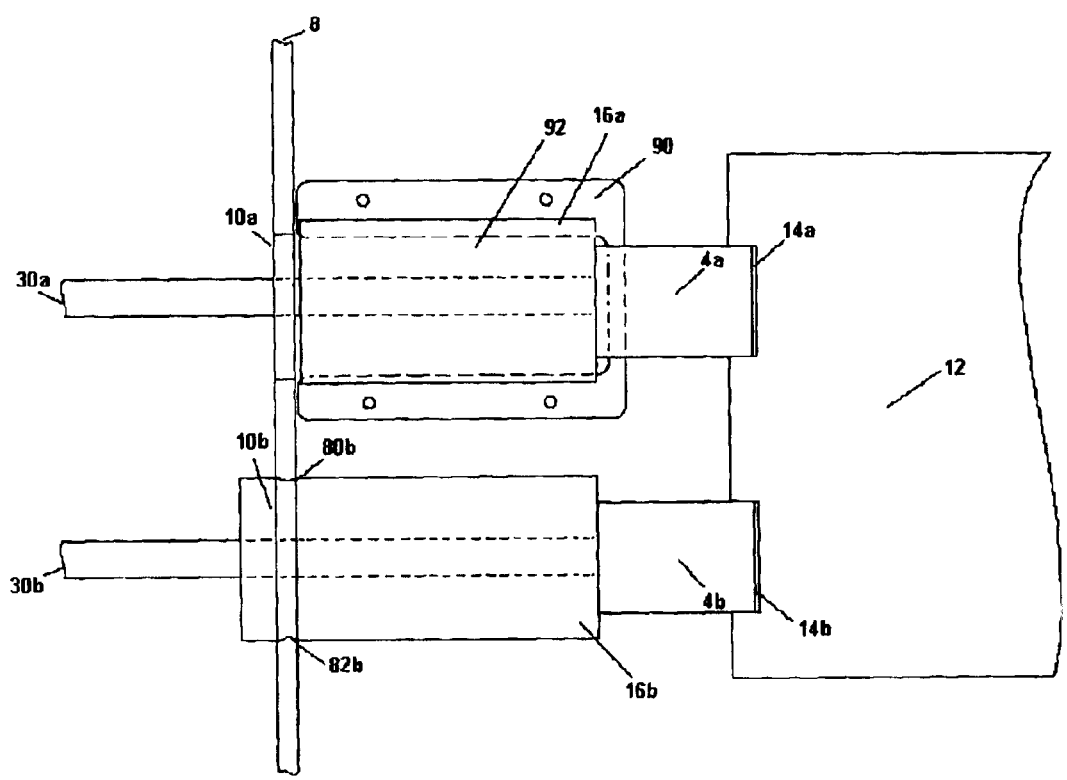
FIG. 4A is a top view of an embodiment of the present invention in which the electronic subsystem is a mother board or a peripheral component interconnect (PCI) card.

FIG. 4A is a top plan view of an embodiment of the present invention wherein the electronic subsystem 12 is a mother board or a peripheral component interconnect (PCI) card. As shown, the connector 4a is inserted into electrical port 14a, such as a horizontally mounted SATA port, and is restrained by compressible grommet 16a. In a preferred embodiment, grommet 16a is fixedly mounted on a connector-support assembly 90 having a cut-out portion 92 for receiving the grommet 16a as described below and in greater detail in conjunction with FIG. 4B. As also shown in FIG. 4A, the connector 4b is inserted into the electrical port 14b and is restrained by the grommet 16b. In a preferred embodiment, the grommet 16b protrudes through the aperture 10 which compresses the grommet 16b in regions adjacent to the aperture 10, such as regions 80b and 82b, to fixate the grommet 16b to the housing 8. In a preferred embodiment, cables 30a and 30b are SATA cables connected to two different remote SATA peripherals (not shown) in a master and slave configuration.

Figure 4B:
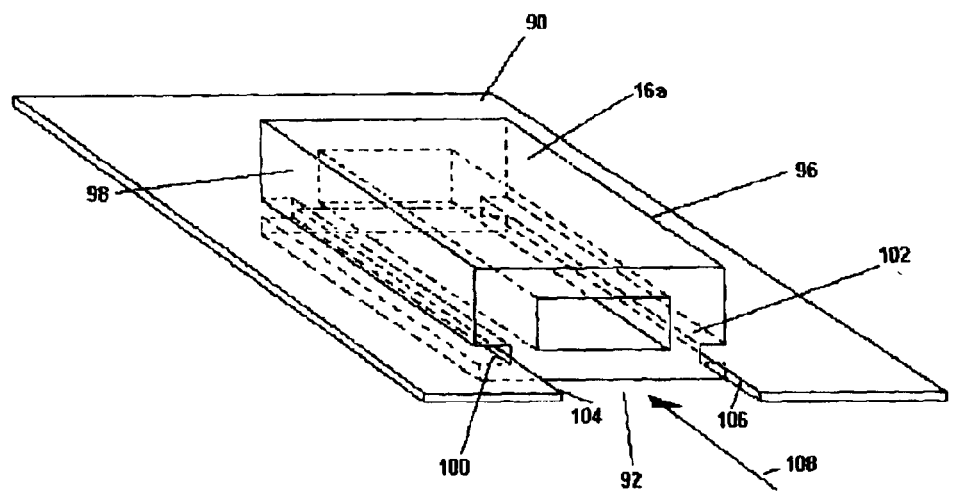
FIG. 4B is a three dimensional view of a preferred embodiment of a compressible grommet shown in FIG. 4A.

FIG. 4B is a three dimensional view of the compressible grommet 16a shown in FIG. 4A. As shown, a pair of linear notches 100 and 102 are formed respectively on the external surfaces 98 and 96 (shown in phantom) of the grommet 16a. The notches 100 and 102 are adapted to receive the interior edges 104 and 106 of the connector-support assembly 90. In a preferred embodiment, grommet 16a is slid into the cutout portion 92 in the direction shown by arrow 108, and the interior edges 104 and 106 are received in notches 100 and 102 respectively, thereby fixating the grommet 16a to the connector-support assembly 90.

It should be noted that in the foregoing embodiments of the present invention shown in FIGS. 3A-D and FIGS. 4A-B, the EMI features and various approaches for fixedly mounting the grommet 16 were discussed separately for clarity of description only and they can be incorporated in whole or in part into a single embodiment of the invention having all or some of these features. It should further be noted that the invention is not limited to disk drives, motherboards or PCI cards but can be readily used in conjunction with virtually any device having an electronic subsystem adapted to receive a connector cable assembly.

What is claimed is:

1. An apparatus for securing a cable assembly having a oconnector within an enclosed electronic system comprising a housing having an aperture and an electronic subsystem mounted with the housing, the electronic subsystem having an electrical port for receiving the connector, the apparatus comprising:

a compressible grommet fixedly mounted within the housing, comprising:
a first surface and a distal surface; and
a channel traversing through the grommet and having a first end at the first surface aligned with the aperture, and a distal end at the distal surface substantially aligned with the electrical port, wherein the grommet is adapted to receive the connector at the first end and to guide the connector along the channel to the distal end and the electrical port, wherein the passage of the connector through the channel causes the grommet to compress in regions of the channel adjacent to the connector to dimensionally enlarge the channel cross-section in the adjacent regions to allow passage of the connector through the channel, wherein the compressed regions revert to a substantially decompressed state following the passage of the connector through the channel wherein the channel substantially reverts to the dimensionally smaller cross section than the connector, and wherein the connector may be thereafter inserted into the electrical port and is thereby restrained by the grommet.

2. The apparatus as defined in claim 1, wherein the channel is of a dimensionally small cross-section than the connector.

3. The apparatus as defined in claim 1, wherein the grommet is in contact with the inserted connector and exerts a bias force in the direction of the electronic subsystem on the inserted connector at the surface to substantially restrain the connector between the electronic subsystem and the distal surface.

4. The apparatus as defined in claim 3, wherein the bias force minimizes a substantially vertical flexing of the inserted due to an a external flexing force exerted on the connector.

5. The apparats as defined in claim 3, wherein the bias force minimizes a substantially de-insertion of the inserted connector from the electrical port due to an external de-insertion force exerted on the connector.

6. The apparatus as defined in claim 1, further comprising:
a connector-support assembly mounted within the housing and substantially aligned with the aperture wherein the compressible grommet is fixedly mounted on the connector-support assembly.

7. The apparatus as defined in claim 6, comprising:
a base plate disposed within the housing wherein the connector-support assembly is mounted on the base-plate.

8. The apparatus as defined in claim 7, wherein the connector-support assembly is rigidly mounted on the base-plate.

9. The apparatus as defined in claim 1, further comprising:
a base plate disposed within the housing wherein the electronic subsystem is mounted on the base-plate.

10. The apparatus as defined in claim 9, wherein the electronic subsystem is floatingly mounted on the base-plate.

11. The apparatus as defined in claim 1, wherein the grommet is a pliable grommet.

12. The apparatus as defined in claim 11, wherein the pliable grommet is of a silicone rubber composition.

13. The apparatus as defined in claim 1, wherein the grommet is an electromagnetic interferences (EMI) shielded grommet.

14. The apparatus as defined in claim 13, wherein the EMI-shielded grommet includes an EMI-shield coating adjacent to the compressible grommet wherein the EMI-shield coating is a of a metallic composition.

15. The apparatus as defined in claim 14, wherein the metallic EMI-shield coating is characterized by a thickness of 0.1 millimeter.

16. The apparatus as defined in claim 13, wherein the EMI-shielded grommet is of a composition enhanced with metallization to minimize EMI.

17. The apparatus as defined in claim 1, wherein the compressible grommet is dimensionally elongated between the first and distal surfaces along the direction of the channel.

18. The apparatus as defined in claim 17, wherein the elongated compressible grommet is of a substantially rectangular-cubic shape.

19. The apparatus as defined in claim 1, wherein the electronic subsystem is a disk drive.

20. The apparatus as defined in claim 1, wherein the electronic subsystem is a motherboard.

21. The apparatus as defined in claim 1, wherein the electronic subsystem is a Peripheral Component Interconnect (PCI) card.

22. The apparatus as defined in claim 1, wherein the cable is an SATA cable.

* * * * *